(12) United States Patent
Agrawal

(10) Patent No.: US 12,525,989 B2
(45) Date of Patent: Jan. 13, 2026

(54) LOOP DELAY COMPENSATION IN A DELTA-SIGMA MODULATOR

(71) Applicant: Texas Instruments Incorporated, Dallas, TX (US)

(72) Inventor: Meghna Agrawal, Bengaluru (IN)

(73) Assignee: Texas Instruments Incorporated, Dallas, TX (US)

( * ) Notice: Subject to any disclaimer, the term of this patent is extended or adjusted under 35 U.S.C. 154(b) by 51 days.

(21) Appl. No.: 18/425,462

(22) Filed: Jan. 29, 2024

(65) Prior Publication Data

US 2024/0171195 A1    May 23, 2024

Related U.S. Application Data

(63) Continuation of application No. 17/380,356, filed on Jul. 20, 2021, now Pat. No. 11,929,765, which is a continuation of application No. 16/911,702, filed on Jun. 25, 2020, now Pat. No. 11,115,044, which is a continuation of application No. 16/583,510, filed on Sep. 26, 2019, now Pat. No. 10,727,859.

(51) Int. Cl.
*H03M 3/00* (2006.01)
*H03M 1/12* (2006.01)
*H03M 3/02* (2006.01)

(52) U.S. Cl.
CPC ............. *H03M 3/37* (2013.01); *H03M 3/464* (2013.01); *H03M 1/12* (2013.01); *H03M 3/02* (2013.01); *H03M 3/30* (2013.01)

(58) Field of Classification Search
CPC ........... H03M 3/37; H03M 3/464; H03M 3/02
See application file for complete search history.

(56) References Cited

U.S. PATENT DOCUMENTS

| | | | |
|---|---|---|---|
| 9,413,383 B1 | 8/2016 | Sharma | |
| 10,727,859 B1 | 7/2020 | Agrawal | |
| 2010/0164638 A1 | 7/2010 | Saw | |
| 2010/0315274 A1 | 12/2010 | Werking | |
| 2013/0021184 A1* | 1/2013 | Ashburn, Jr. | ......... H03M 3/374 341/143 |
| 2016/0261277 A1 | 9/2016 | Wang et al. | |
| 2016/0380646 A1 | 12/2016 | Kauffman et al. | |

* cited by examiner

*Primary Examiner* — Joseph J Lauture
(74) *Attorney, Agent, or Firm* — Xianghui Huang; Frank D. Cimino

(57) ABSTRACT

A delta-sigma modulator includes a first integrator and a comparator. The comparator's positive input couples to the first integrator's positive output, and the comparator's negative input couples to the first integrator's negative output. A first current DAC comprises a current source device, and first and second transistors. The first transistor has a first transistor control input and first and second current terminals. The first current terminal couples to the current source device, and the second current terminal couples to the first integrator positive output. The second transistor has a second transistor control input and third and fourth current terminals. The third current terminal couples to the current source device, and the fourth current terminal couples to the first integrator negative output. A first capacitive device couples to the second transistor control input and to both the second current terminal and the first integrator positive output.

23 Claims, 2 Drawing Sheets

LOOP DELAY COMPENSATION IN A
DELTA-SIGMA MODULATOR

CROSS REFERENCE TO RELATED APPLICATIONS

This application is a continuation of and claims priority to U.S. patent application Ser. No. 17/380,356, filed on Jun. 20, 2021, which claims priority to U.S. patent application Ser. No. 16/911,702, filed on Jun. 25, 2020 (now U.S. Pat. No. 11,115,044, issued on Sep. 7, 2021), which claims priority to U.S. patent application Ser. No. 16/583,510 (now U.S. Pat. No. 10,727,859, issued on Jul. 28, 2020), all of which are hereby incorporated herein by reference in their entireties.

BACKGROUND

An analog-to-digital converter (ADC) converts an input analog signal into a digital signal. One type of ADC includes a delta-sigma modulator in which a change in the analog input signal is encoded. The modulator includes, among other components, an integrator and a comparator. The output of the comparator is used to generate a feedback signal for the integrator. Continuous-time delta-sigma modulators suffer from excess loop delay due to the propagation delay through the comparator. The comparator samples the output signal from the integrator and compares the sampled output signal to a threshold. Any propagation delay through the comparator means that the feedback signal from the comparator is not based on the current comparator output signal but rather on a delayed comparator output signal. The comparator delay degrades the performance of the feedback loop, and the comparator delay can cause the modulator to be unstable.

SUMMARY

In one example, a delta-sigma modulator includes a first integrator and a comparator. The comparator's positive input couples to the first integrator's positive output, and the comparator's negative input couples to the first integrator's negative output. A first current DAC comprises a current source device, and first and second transistors. The first transistor has a first transistor control input and first and second current terminals. The first current terminal couples to the current source device, and the second current terminal couples to the first integrator positive output. The second transistor has a second transistor control input and third and fourth current terminals. The third current terminal couples to the current source device, and the fourth current terminal couples to the first integrator negative output. A first capacitive device couples to the second transistor control input and to both the second current terminal and the first integrator positive output.

BRIEF DESCRIPTION OF THE DRAWINGS

For a detailed description of various examples, reference will now be made to the accompanying drawings in which.

DETAILED DESCRIPTION

Figure 1:
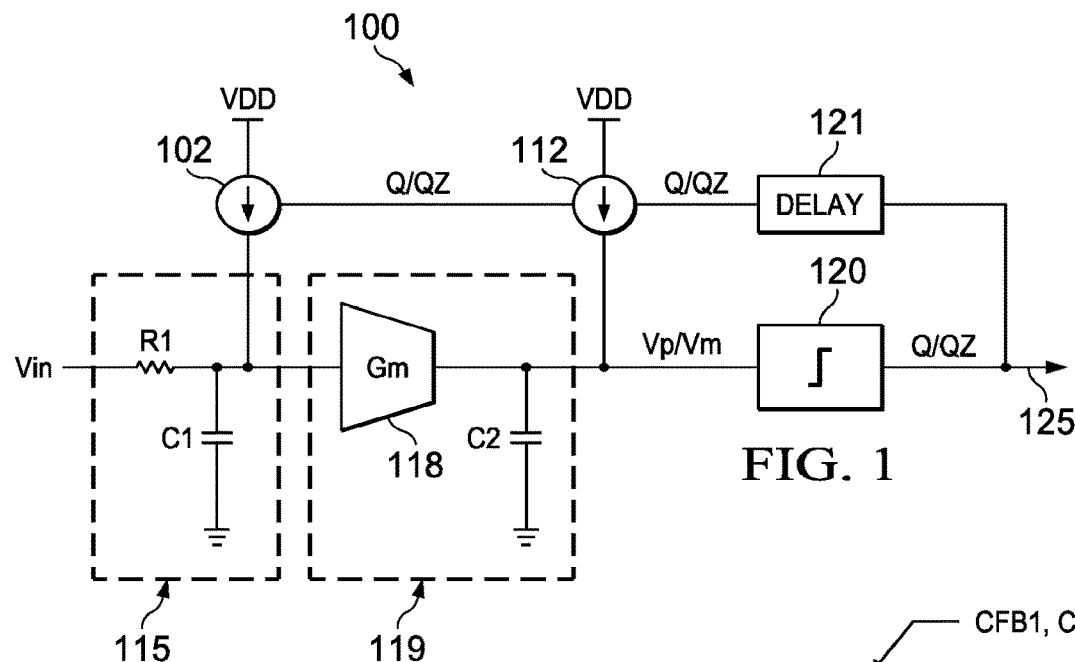
FIG. 1 is an example implementation of an ADC with a delta-sigma modulator.

FIG. 1 shows an example implementation of a second order delta-sigma modulator 100. In this example, the delta-sigma modulator 100 includes integrators 115 and 119, a comparator 120, and current digital-to-analog converters (DACs) 102 and 112. Delay 121 is also shown and delay 121 represents the propagation delay through the comparator 120. Integrator 115 includes resistor R1 and capacitor C1. Integrator 119 includes transconductance amplifier (Gm) 118 and capacitor C2. An input voltage, Vin, is converted to a digital value which is provided to resistor R1. For simplicity, Vin is shown in FIG. 1 as single-ended signal, but Vin may comprise a differential signal (Vinp and Vinm) and is illustrated as such in the example of FIG. 2. The other terminal of resistor R1 is connected to capacitor C1 (which, in turn, is connected to ground) and to an input of Gm 118. The output of Gm 118 also is a differential signal comprising signals Vp and Vm and is coupled to capacitor C2 (which is connected to ground as shown) and to an input of comparator 120.

The output of comparator 120 also is used to control the current DACs 112 and 102. The output of comparator 120 is shown as Q and QZ. Output QZ is the logical inverse of Q. In one example, responsive to Q being logic high, current from current DAC 112 is injected into the node between Gm 118 and comparator 120 comprising Vp. Responsive to Q being low (QZ being high), current from current DAC 112 is injected into the node comprising Vm. Current from current DAC 112 is injected into one, but not both, of the nodes comprising Vp or Vm depending on the state of the Q output of comparator 120. Similarly, current from current DAC 102 is injected into the positive signal node between the integrator 115 and the Gm 119 when Q is high, whereas current from the current DAC 102 is injected into the negative signal node between the integrator 115 and Gm 119 when Q is low.

As noted above, delay 121 represents the propagation delay through the comparator 120. FIG. 1 illustrates that the feedback loop comprising current DACs 102 and 112 uses the previous Q/QZ output from the comparator 120 while the comparator 120 is sampling new values of Vp and Vm. The delay introduced by comparator 120 can cause instability. One solution to the instability problem could be to add a pre-amplifier between integrator 119 and comparator 120, and a third current DAC to inject current into the node between the pre-amplifier and the comparator 120. Such a system would include three feedback loops, with the third feedback loop used to compensate the delay 121 caused by the comparator 120. This system would have three current DACs and a pre-amplifier resulting in a relatively complicated design.

Figure 2:
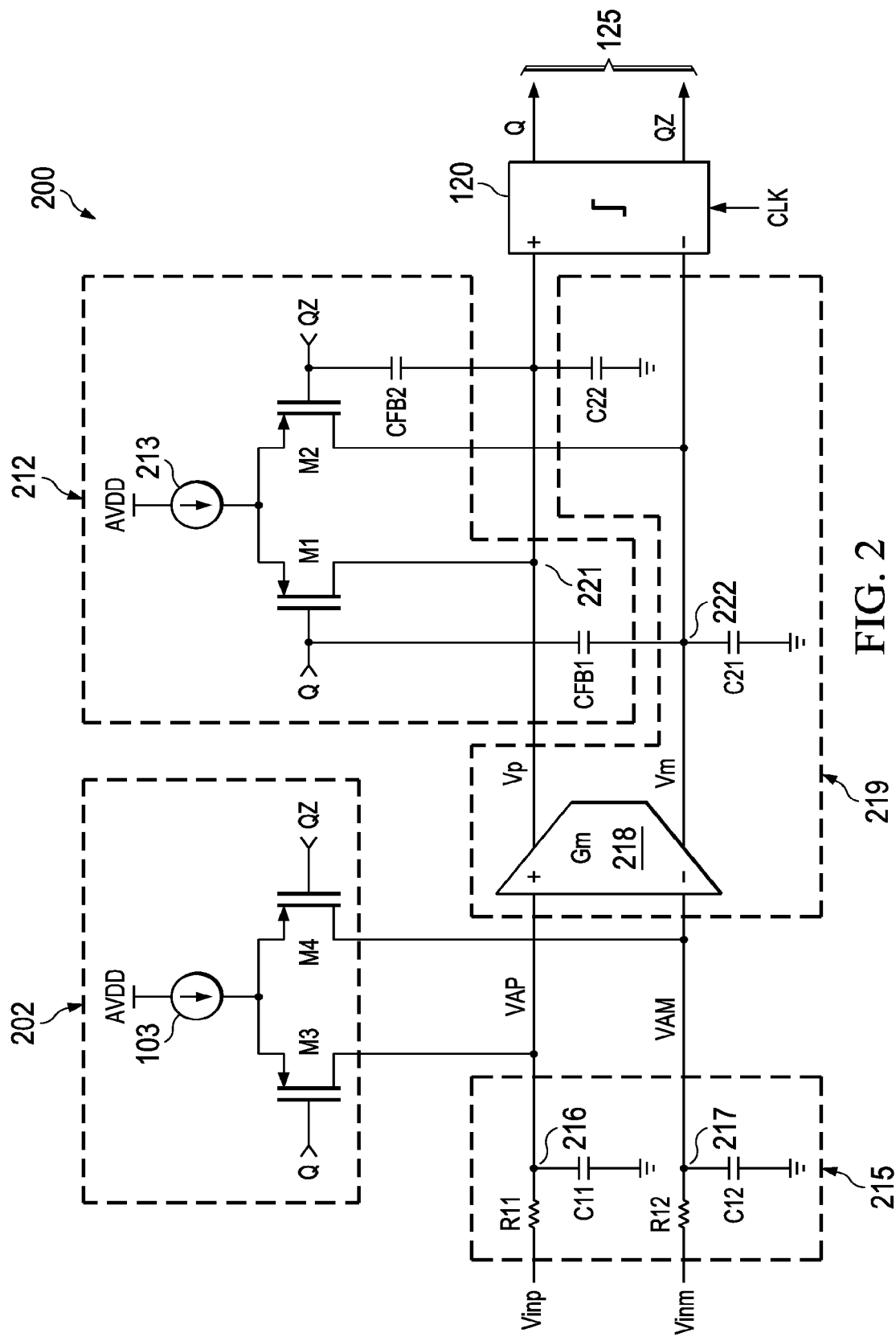
FIG. 2 is another example implementation of an ADC with a delta-sigma modulator and including compensation for the delay introduced by the latch.

FIG. 2 shows another example implementation of a delta-sigma modulator 200. In the example of FIG. 2, the delta-sigma modulator 200 includes integrators 215 and 219, comparator 120, and current DACs 202 and 212. The input voltage comprises VINP and VINM. The integrator 215 includes two resistor-capacitor pairs R11/C11 and R12/C12. Each input voltage VINP/VINM is provided to its respective resistor R11/R12, and each resistor R11/R12 is connected to its respective capacitor C11/C12 at node 216/217 as shown. The voltage on node 216 is designated VAP and the voltage on node 217 is designated VAM. The positive input of GM 218 is coupled to resistor R11 and capacitor C11 at node 216. The negative input of GM 218 is coupled to resistor R12 and capacitor C12 at node 217. In this example, resistors R11 and R12 have the same resistance and capacitors C11 and C12 have the same capacitance. As such, voltage VAP is provided to the positive input of the GM 218, and voltage VAM is provided to the negative input of the GM 218. The output of GM 218 comprises a differential voltage formed by voltages VP and VM. The positive output of the GM 218 is coupled to a positive input of comparator 120 at node 221, and the negative output of GM 218 is coupled to a negative input of comparator 120 at node 222. A capacitor C21 is coupled between 222 and ground as shown. Similarly, a capacitor C22 is coupled between node 221 and ground. Capacitors C21 and C22 have the same capacitance in this example. Comparator 120 includes a Q output and its logical inverse, QZ. A clock signal (CLK) is used to cause the comparator 120 to sample the input VP/VM.

Current DAC 202 comprises a current source device 103 and a pair of P-type metal oxide semiconductor field effect transistors (PMOS) M3 and M4. In other examples, transistors M3 and M4 can be implemented as different types of transistors. The sources of transistors M3 and M4 are connected to the current source device 103. The drain of transistor M3 is connected to node 216 (VAP), and the drain of transistor M4 is connected to node 217 (VAM). The gate of transistor M3 is coupled to the Q output of comparator 120, and the gate of transistor M4 is coupled to the QZ output of comparator 120. When Q is low and QZ is high, transistor M3 is on and transistor M4 is off, and current from current source device 103 flows through transistor M3 into node 216. Reciprocally, when Q is high and QZ is low, transistor M3 is off, transistor M4 is on, and current from current source device 103 flows through transistor M4 into node 217. As such, the current from current source device 103 flows either into node 216 or node 217 based on the logical state of the output of comparator 120.

Current DAC 212 includes a current source device 213, transistors M1 and M2, and feedback compensation capacitors CFB1 and CFB2. Capacitors CFB1 and CFB2 have the same capacitance in this example. Transistors M1 and M2 comprise PMOS transistors in this example but can be implemented as other types of transistors in other examples. The sources of transistors M1 and M2 are connected to current source device 213. The drain of transistor M1 is connected to node 221 (VP), and the drain of transistor M2 is connected to node 222 (VM). Feedback capacitor CFB1 is connected between the gate of transistor M1 and node 222 (VM). Feedback capacitor CFB2 is connected between the gate of transistor M2 and node 221 (VP). The gate of transistor M1 is controlled by the Q output of comparator 120, and the gate of transistor M2 is controlled by the QZ output of comparator 120.

Feedback capacitors CFB1 and CFB2 compensate the feedback loop for the propagation delay of comparator 120. The feedback coefficient is AVDD*CFB/(CFB+C2), where AVDD is the supply voltage, CFB refers to the capacitance of CFB1 (or CFB2), and C2 refers to the capacitance of C21 (or C22). Capacitors CFB1 and CFB2 represent compensation capacitors and their use to compensate for the delay due the comparator 120 is described below.

Figure 3:
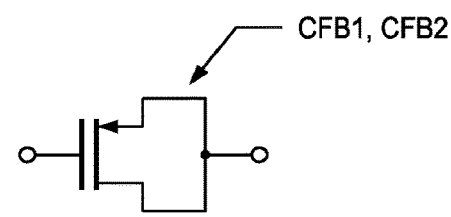
FIG. 3 is an example implementation of a capacitor used to compensate for the latch's delay.

In one example, capacitors CFB1 and CFB2 are capacitive devices implemented as actual capacitors. In another example as in FIG. 3, each CFB1/CFB2 capacitor is implemented as a transistor device (e.g., PMOS device) whose drain and source are connected together as shown.

Figure 4:
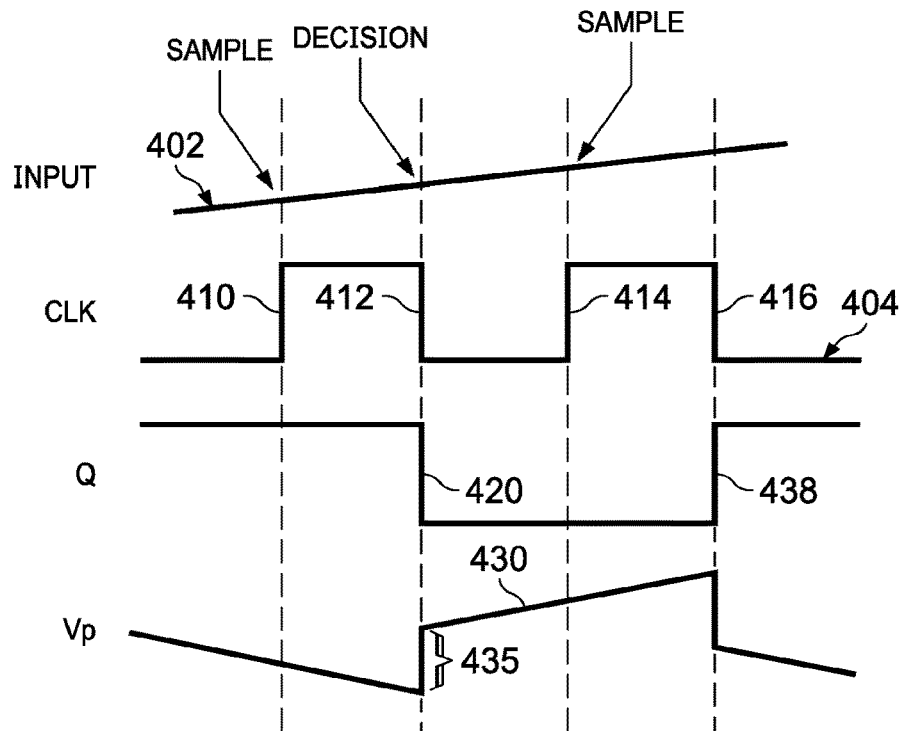
FIG. 4 shows example waveforms of the ADC of FIG. 2.

FIG. 4 shows a timing diagram including an input signal 402, the clock signal (CLK) 404, the Q output of comparator 120, and the VP voltage. The input signal 402 represents the difference in voltage between VP and VM (output of Gm 218). In this example the input signal 402 is increasing as shown. The clock signal 404 is used to clock the comparator 120, and has rising edges 410 and 414, and falling edges 412 and 416 as shown. The comparator 120 samples the output signal from GM 218 (VP, VM) at rising edges 410 and 414 of the clock signal 404. The Q and QZ outputs from comparator 120 are available at falling edges 412 and 416. When Q transitions from high to low at 420, transistors M1 and M3 are turned on in their respective current DACs, and current flows into nodes 221 and 216 and charges capacitors C11 and C22 connected to those nodes. As a result, the voltage (VP) across capacitor C22 connected to node 221 increases as shown at 430. Reciprocally, when Q transitions from low to high (at 438), transistors M2 and M4 are turned on in their respective current DACs, and current flows into nodes 222 and 217 and charges capacitors C12 and C21 connected to those nodes. As a result, the voltage (VM) across capacitor C21 connected to node 222 will decrease.

In the absence of compensation capacitors CFB1 and CFB2, the voltages on nodes 221 and 22 will be only linearly increase/decrease due to charging/discharging of the current into capacitors C21/C22. Capacitors CFB1/CFB2 are added in series with capacitors C21/C22 as shown, so that when Q/Qz makes a transition, a voltage division occurs based on the ratios of CFB1/C21 and CFB2/C22. For example, if Q is transitioning from 1.2 V to 0 V (falling edge 420), and the ratio of the capacitances of CFB2 to C22 is 0.1, then a voltage level step up of approximately 120 mV will be seen at capacitor C22, as illustrated at 435. Voltage jump 435 is equivalent to adding a constant voltage when Q is high (or subtracting a constant voltage when Q is low) at the output of GM 218. This voltage addition serves as the compensation for the delay of comparator 120. A corresponding step down on the voltage level of VM on node 222 will occur when M1 turns off and M2 turns on.

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors. Modifications are possible in the described embodiments, and other embodiments are possible, within the scope of the claims.

What is claimed is:

1. A circuit, comprising:
   a first integrator circuit comprising an input and an output;
   a comparator comprising an input and an output, the input coupled to the output of the first integrator circuit;
   a first digital-to-analog converter (DAC) coupled to the output of the first integrator circuit; and
   a first capacitor, comprising a first terminal and a second terminal, wherein the first terminal is coupled to the output of the comparator and the second terminal is coupled to the input of the comparator.

2. The circuit of claim 1, wherein:
   the output of the first integrator circuit is a first output of the first integrator circuit, and the first integrator circuit further comprises a second output;
   the input of the comparator is a first input of the comparator, and the comparator further comprises a second input that is coupled to the second output of the first integrator circuit;

the output of the comparator is a first output of the comparator, and the comparator further comprises a second output; and the circuit further comprises a second capacitor coupled between the second output of the comparator and the second output of the first integrator circuit.

3. The circuit of claim 2, wherein the comparator is configured to:
provide a first signal at the first output of the comparator; and
provide a second signal at the second output of the comparator that is logically inverse to the first signal.

4. The circuit of claim 2, wherein the first integrator circuit comprises:
a third capacitor coupled between the first output of the first integrator circuit and ground; and
a fourth capacitor coupled between the second output of the first integrator circuit and the ground.

5. The circuit of claim 2, wherein the first integrator circuit comprises:
a transconductance amplifier comprising a first output and a second output, the first output coupled to the first output of the first integrator circuit, and the second output coupled to the second output of the first integrator circuit.

6. The circuit of claim 2, wherein:
the first DAC comprises a first transistor and a second transistor;
the first transistor comprises a first current conduction terminal, a second current conduction terminal, and a control terminal, the first current conduction terminal coupled to a first current source, the second current conduction terminal coupled to the second output of the first integrator circuit, and the control terminal coupled to the first output of the comparator; and
the second transistor comprises a first current conduction terminal, a second current conduction terminal, and a control terminal, the first current conduction terminal coupled to the first current source, the second current conduction terminal coupled to the first output of the first integrator circuit, and the control terminal coupled to the second output of the comparator.

7. The circuit of claim 6, further comprising a second integrator circuit comprising a first output and a second output, and a second DAC, wherein:
the second DAC comprises a third transistor and a fourth transistor;
the third transistor comprises a first current conduction terminal, a second current conduction terminal, and a control terminal, the first current conduction terminal coupled to a second current source, the second current conduction terminal coupled to the second output of the second integrator circuit, and the control terminal coupled to the first output of the comparator; and
the fourth transistor comprises a first current conduction terminal, a second current conduction terminal, and a control terminal, the first current conduction terminal coupled to the second current source, the second current conduction terminal coupled to the first output of the second integrator circuit, and the control terminal coupled to the second output of the comparator.

8. The circuit of claim 1, further comprising:
a second integrator circuit comprising an output, the output coupled to the input of the first integrator circuit; and
a second DAC coupled to the output of the second integrator circuit.

9. The circuit of claim 8, wherein:
the input of the first integrator circuit is a first input of the first integrator circuit, and the first integrator circuit further comprises a second input; and
the output of the second integrator circuit is a first output of the second integrator circuit, and the second integrator circuit further comprises a second output that is coupled to the second input of the first integrator circuit.

10. The circuit of claim 8, wherein the second integrator circuit comprises:
a first resistor coupled to the first output of the second integrator circuit;
a fifth capacitor coupled between the first output of the second integrator circuit and ground;
a second resistor coupled to the second output of the second integrator circuit; and
a sixth capacitor coupled between the second output of the second integrator circuit and ground.

11. The circuit of claim 1, wherein the first capacitor is configured to cause a voltage change at the input of the comparator in response to a voltage change at the output of the comparator.

12. A circuit, comprising:
a first integrator circuit comprising a first input, a second input, a first output, and a second output;
a comparator comprising a first input, a second input, a first output, and a second output, the first input coupled to the first output of the first integrator circuit, and the second input coupled to the second output of the first integrator circuit;
a first digital-to-analog converter (DAC) coupled to the first and second outputs of the first integrator circuit; and
a first capacitor coupled between the first output of the comparator and the first output of the first integrator circuit.

13. The circuit of claim 12, further comprising:
a second capacitor coupled between the second output of the comparator and the second output of the first integrator circuit.

14. The circuit of claim 12, wherein the comparator is configured to:
provide a first signal at the first output of the comparator; and
provide a second signal at the second output of the comparator that is logically inverse to the first signal.

15. The circuit of claim 12, wherein the first integrator circuit comprises:
a third capacitor coupled to the first output of the first integrator circuit; and
a fourth capacitor coupled to the second output of the first integrator circuit.

16. The circuit of claim 12, wherein the first integrator circuit comprises:
a transconductance amplifier comprising a first output and a second output, the first output coupled to the first output of the first integrator circuit, and the second output coupled to the second output of the first integrator circuit.

17. The circuit of claim 12, wherein:
the first DAC comprises a first transistor and a second transistor;
the first transistor comprises a first current conduction terminal, a second current conduction terminal, and a control terminal, the first current conduction terminal coupled to a first current source, the second current conduction terminal coupled to the second output of the first integrator circuit, and the control terminal coupled to the first output of the comparator; and the second transistor comprises a first current conduction terminal, a second current conduction terminal, and a control terminal, the first current conduction terminal coupled to the first current source, the second current conduction terminal coupled to the first output of the first integrator circuit, and the control terminal coupled to the second output of the comparator.

18. The circuit of claim 17, wherein:

the first transistor is a first p-channel MOSFET (PMOS), the first current conduction terminal is a source of the first PMOS, the second current conduction terminal is a drain of the first PMOS, and the control terminal is a gate of the first PMOS; and The second transistor is a second p-channel MOSFET (PMOS), the first current conduction terminal is a source of the second PMOS, the second current conduction terminal is a drain of the second PMOS, and the control terminal is a gate of the second PMOS.

19. The circuit of claim 17, further comprises a second integrator circuit comprising a first output and a second output, and a second DAC wherein:

the second DAC comprises a third transistor and a fourth transistor;

the third transistor comprises a first current conduction terminal, a second current conduction terminal, and a control terminal, the first current conduction terminal coupled to a second current source, the second current conduction terminal coupled to the second output of the second integrator circuit, and the control terminal coupled to the first output of the comparator; and the fourth transistor comprises a first current conduction terminal, a second current conduction terminal, and a control terminal, the first current conduction terminal coupled to the second current source, the second current conduction terminal coupled to the first output of the second integrator circuit, and the control terminal coupled to the second output of the comparator.

20. The circuit of claim 11, further comprising:

a second integrator circuit comprising a first output and a second output, the first output coupled to the first input of the first integrator circuit, and the second output coupled to the second input of the first integrator circuit; and a second DAC coupled to the first and second outputs of the second integrator circuit.

21. The circuit of claim 20, wherein the second integrator circuit comprises:

a first resistor coupled to the first output of the second integrator circuit;

a fifth capacitor coupled to the first output of the second integrator circuit;

a second resistor coupled to the second output of the second integrator circuit; and a sixth capacitor coupled to the second output of the second integrator circuit.

22. The circuit of claim 12, wherein a first voltage change at the input of the comparator in response to a second voltage change at the output of the comparator is based on a capacitance of the first capacitor.

23. The circuit of claim 12, wherein the first capacitor is configured to compensate for a delay in the comparator.

* * * * *